US008717056B2

(12) United States Patent
McQuade

(10) Patent No.: US 8,717,056 B2
(45) Date of Patent: May 6, 2014

(54) PROBING ASSEMBLY FOR TESTING INTEGRATED CIRCUITS

(76) Inventor: Francis T. McQuade, Hutto, TX (US)

(*) Notice: Subject to any disclaimer, the term of this patent is extended or adjusted under 35 U.S.C. 154(b) by 153 days.

(21) Appl. No.: 13/427,197

(22) Filed: Mar. 22, 2012

(65) Prior Publication Data

US 2013/0249586 A1 Sep. 26, 2013

(51) Int. Cl.
G01R 31/00 (2006.01)
G01R 1/00 (2006.01)
G01R 1/06 (2006.01)
G01R 1/067 (2006.01)
G01R 1/073 (2006.01)

(52) U.S. Cl.
USPC ............ 324/756.03; 324/755.05; 324/755.06

(58) Field of Classification Search
CPC ........ G01R 31/2889; G01R 1/00; G01R 1/06; G01R 1/067; G01R 1/073
USPC ........................... 324/756.03, 755.06, 755.05
See application file for complete search history.

(56) References Cited

U.S. PATENT DOCUMENTS

| 4,563,640 | A | * | 1/1986 | Hasegawa | ................ | 324/756.03 |
| 5,416,429 | A | * | 5/1995 | McQuade et al. | ....... | 324/754.07 |
| 2004/0086424 | A1 | * | 5/2004 | Schembri | ......................... | 422/58 |
| 2005/0209627 | A1 | * | 9/2005 | Kick et al. | ..................... | 606/191 |

* cited by examiner

Primary Examiner — Jermele M Hollington
Assistant Examiner — Farhana Hoque
(74) Attorney, Agent, or Firm — Anthony P. Ng; Yudell Isidore ng Russell PLLC

(57) ABSTRACT

A probing assembly is disclosed. The probing assembly includes an interface board, a structural support element, a trace support element and a probe support element. The structural support element provides structural and mechanical support to the trace support element. The trace support element includes a body and multiple trace lines located on the body. The probe support element includes a plate having multiple guide holes in which micro probes are inserted. At least one of the micro pins is in contact with one of the trace lines within the trace support element. A set of rails are utilized to secure the probe support element, the trace support element and the structural support element to the interface board.

10 Claims, 4 Drawing Sheets

PROBING ASSEMBLY FOR TESTING INTEGRATED CIRCUITS

BACKGROUND OF THE INVENTION

1. Technical Field

The present invention relates to probe assemblies in general, and in particular to a probing assembly for testing integrated circuits fabricated on a wafer.

2. Description of Related Art

After integrated circuits (ICs) have been fabricated on a wafer, the wafer can be divided into multiple rectangular-shaped chips. Each chip has a rectangular (or other regular) arrangement of metallic contact pads through which electrical connections can be made. For efficiency sake, the testing of the chips is preferably performed while the chips are still joined together on the wafer. One typical procedure is to support the wafer on a flat stage or "chuck" and to move the wafer in X, Y and Z directions relative to the head of a probing assembly so that contacts on the probing assembly move relative to the surface of the wafer for consecutive engagement with the bond pads of one or more of test structures on the wafer. Various conductors that interconnect the test instrumentation with the contacts on the probing system enable each chip on the wafer to be sequentially connected to the test instrumentation and be tested.

The contacts of a conventional probing system include a beam affixed to the lower surface of a membrane assembly and is conductively interconnected with corresponding traces located on the surface of a membrane of the membrane assembly. A contact bump for engaging a bond pad of a device-under-test (DUT) is affixed to one end of the beam. When the contact bump is pressed against the bond pad of the DUT, the membrane assembly is deflected, compressing a portion of the elastomeric layer proximate the end of the beam to which the contact bump is affixed. The compliance of the elastomeric layer enables relative displacement of the respective contact bumps and facilitates simultaneous engagement with multiple bond pads that may have respective contact surfaces that lie in different planes. The resilience of an elastomeric layer of the membrane assembly controls the force exerted by the contacts and returns the contacts to the at-rest position when the probe is withdrawn from pressing engagement with the DUT. In order to maintain good compliance, more forces need to be exerted on the membrane assembly, which can shortened the service life of the membrane assembly.

Consequently, it would be desirable to provide an improved probing assembly.

SUMMARY OF THE INVENTION

In accordance with a preferred embodiment of the present invention, a probing assembly includes an interface board, a structural support element, a trace support element and a probe support element. The structural support element provides structural and mechanical support to the trace support element. The trace support element includes a body and multiple trace lines located on the body. The probe support element includes a plate having multiple guide holes in which micro probes are inserted. At least one of the micro pins is in contact with one of the trace lines within the trace support element. A set of rails are utilized to secure the probe support element, the trace support element and the structural support element to the interface board.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
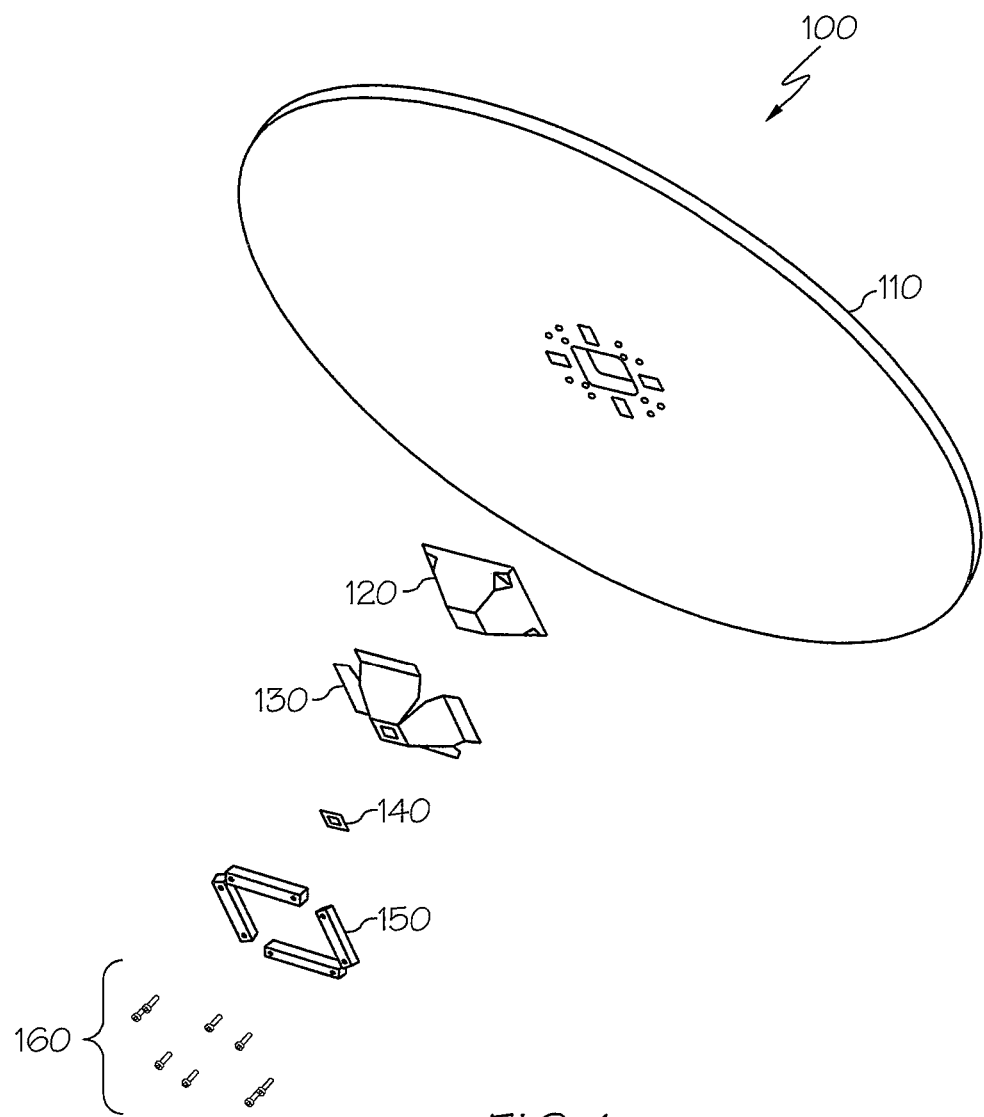
FIG. 1 is an isometric view of various components within a probing assembly, in which a preferred embodiment of the present invention can be incorporated.

Referring now to the drawings and in particular to FIG. 1, there is depicted an isometric view of various components within a probing assembly, in which a preferred embodiment of the present invention can be incorporated. As shown, a probing assembly 100 includes an interface board 110, a structural support element 120 and a trace support element 130, a probe support element 140 and multiple rails 150.

Preferably, structural support element 120 has the shape of a pyramid with a flat or truncated top. Structural support element 120 is preferably made of an electrical insulating material such as Torlon® polyamide-imide manufactured by Quadrant Engineering or polyetheretherketone (PEEK)—a heat-resistant thermoplastic. Structural support element 120 is preferably rigid in order to provide structural and mechanical support for trace support element 130. Structural support element 120 and trace support element 130 can be detachably connected to one side of interface board 110 by means of a set of rails 150 and multiple screws 160. Probe support element 140 can be detachably connected to structural support element 120 and trace support element 130 via a screw through the center of probe support element 140.

Figure 2:
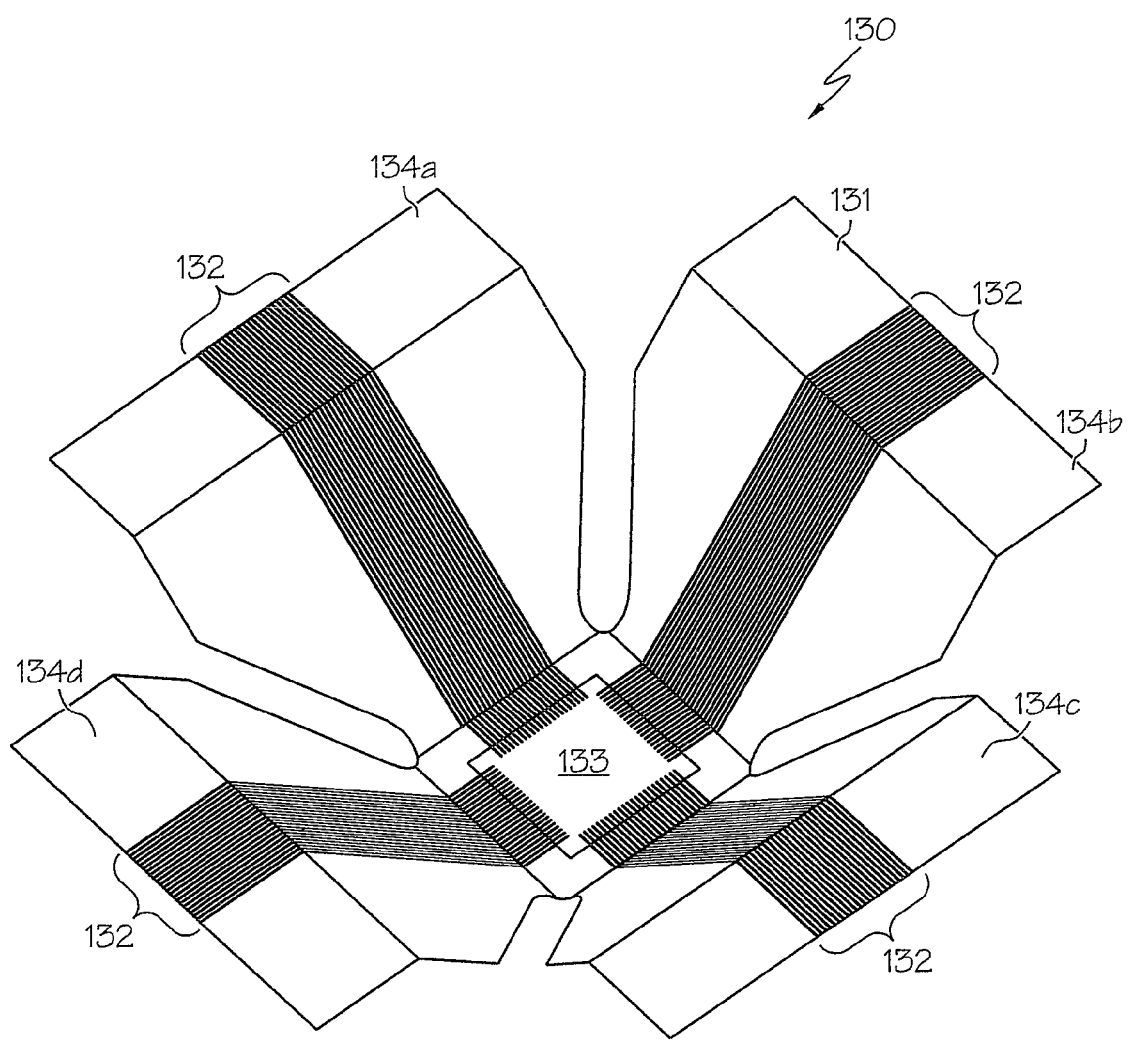
FIG. 2 is an isometric view of a trace support element within the membrane probing assembly from FIG. 1.

With reference now to FIG. 2, there is depicted an isometric view of trace support element 130. As shown, trace support element 130 includes a membrane 131 preferably made of a flexible electrical insulating membrane such as polymide film. Membrane 131 can be a single layer membrane or made up of multiple layers. Membrane 131 has a rectangular or square center having each of the four edges extended to four "wing" structures, such as wing structure extensions 134a-134d. Membrane 131 also has an opening 133 located at the middle of the center, and opening 133 can be rectangular or square in shape. Flexible electrical conductive trace lines 132 are disposed on one surface of membrane 131 (or between multiple layers of membranes 131) along each of the four wing structure extensions. Trace lines 132 are preferably made from a spring type material such as beryllium copper (also known as copper beryllium), beryllium bronze or spring copper (i.e., a copper alloy with 0.5-3.0% beryllium and sometimes with other alloying elements). Trace lines 132 are arranged to extend from each of the wing structure extensions into opening 133. Trace lines 132 are flushed with the edges of wing structure extensions, but extended into opening 133. Trace lines 132 are configured to communicate electrical signals between a test instrument (to be in contact with interface board 110 from FIG. 1) and an integrated circuit (IC) device-under-test (DUT) (to be in contact with probe support element 140 from FIG. 1).

Figure 3A:
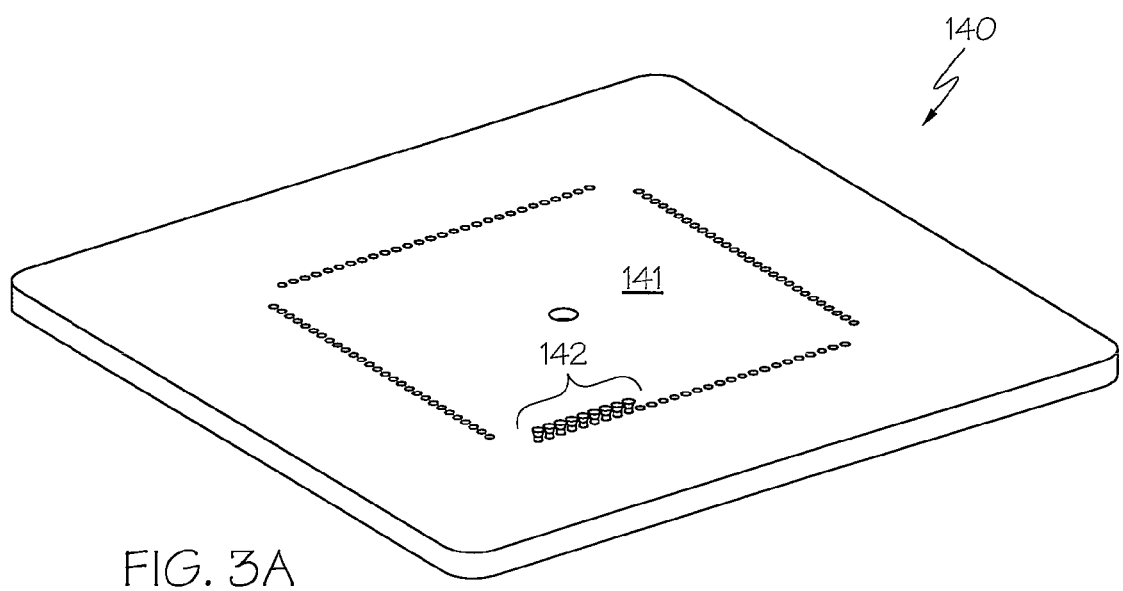
FIGS. 3a-3b are an isometric view and a cross-sectional view of a probe support element within the membrane probing assembly from FIG. 1.
Figure 3B:
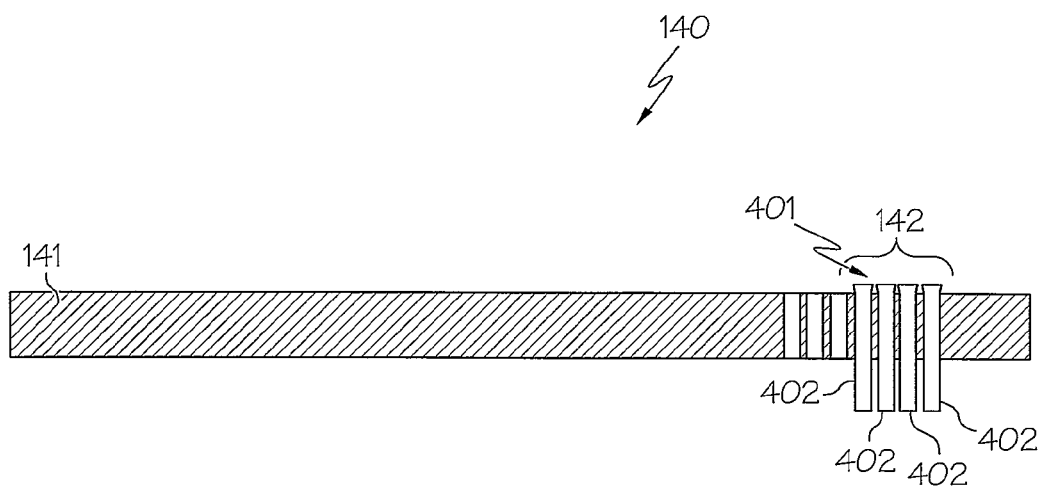

Referring now to FIGS. 3a-3b, there are depicted an isometric and cross-sectional views of probe support element 140, respectively. As shown, probe support element 140 includes a planar plate 141 having multiple guide holes in which micro probes 142 can be inserted. The exact positions of guide holes and micro probes 142 on plate 141 depend on the locations of the test pads within a DUT. In the present example, guide holes and micro probes 142 are aligned along the peripheral of plate 141.

The vertical distance that each of micro probes 142 may travel within its guide hole is controlled by a prober (not shown). Once an initial electrical contact is made with a DUT, the probing over-travel is controlled by a setting in the prober software. This over-travel is measured in microns and a typical setting would be approximately 125 microns.

Each of micro probes 142 includes an upper contact tip 401. Preferably, upper contact tip 401 is configured to provide electrical contact to one of trace lines 132 from FIG. 2. The size of upper contact tip 401 is larger than the size of a guide hole in plate 141 in order to prevent micro probe 142 from falling through the guide hole. Micro probe 142 also includes a lower contact tip 402. Preferably, lower contact tip 402 is configured to provide contact to a test pad on a semiconductor wafer. Lower contact tip 402 may be of any shape such as flat tips, canonical pointed tips (i.e., cone shapes), crowned tips, edge tips, or round tips.

Figure 4:
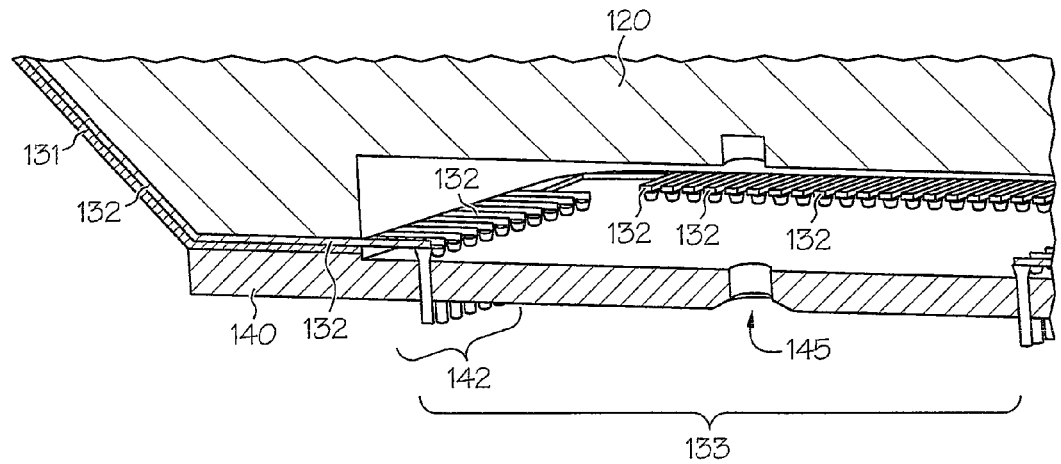
FIG. 4 shows an isometric cross-sectional view of structural support element, trace support element and probe support element.

With reference now to FIG. 4, there are depicted an isometric cross-sectional view of structural support element 120, trace support element 130 and probe support element 140 connected to each other. As shown, trace support element 130 is form fitted to structure support element 120 such that structural support element 120 can provide structural and mechanical support to membrane 131 and trace lines 132 of trace support element 130. In addition, probe support element 140 can be secured to structure support element 120 via a screw (not shown) through a center opening 145.

Within opening 133 of trace support element 130, each of trace lines 132 from trace support element 130 is in direct contact with an upper contact tip 401 of a corresponding micro probe 142.

Figure 5A:
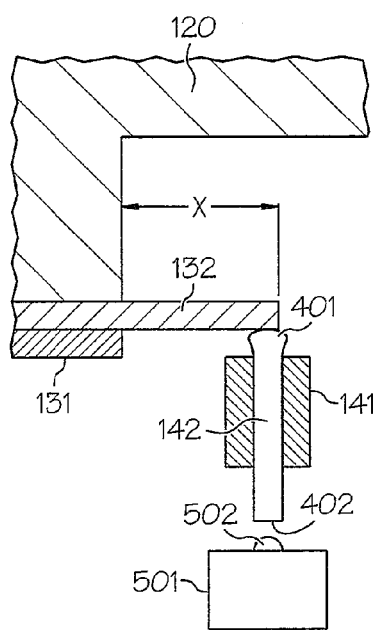
FIGS. 5a-5b show the actuation of the micro probes within the membrane probing assembly from FIG. 1.
Figure 5B:
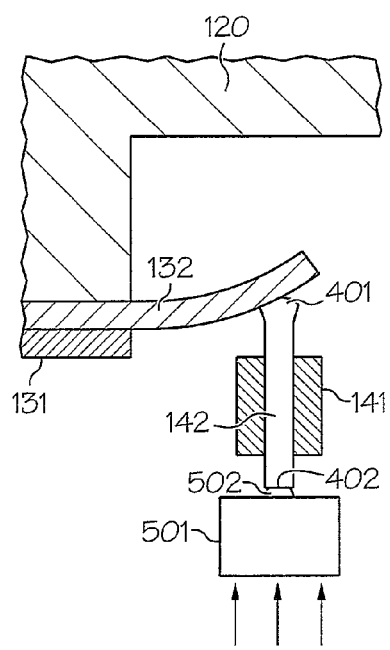

Referring now to FIGS. 5a and 5b, there are illustrated the actuation of micro probe 142 as a DUT 501 moves vertically so that a micro bump 502 engages lower contact tip 402 of micro probe 142. The bond pad of DUT 501 may or may not contain micro bump 502. FIG. 5a shows micro probe 142 in an uncompressed condition when micro bump 502 of DUT 501 is not yet in contact with lower contact tip 402 of micro probe 142. At this point, upper contact tip 401 of micro probe 142 abuts against the upper side of the guide hole of plate 141, which prevents any further extension downward of lower contact tip 402.

FIG. 5b shows micro probe 142 being in contact with micro bump 502 of DUT 501. Micro bump 502 initially contacts lower contact tip 402 of micro probe 142, and further upward vertical motion of DUT 501 causes micro probe 142 to move up through the guide hole in plate 141, thereby flexing trace lines 132 which increases the corresponding gram (or spring) force micro probe 142 exerts on micro bump 502.

The compliance of each of micro probes 142 in plate 141 is independent. Also, thicker micro probes 142 can be utilized for a given pitch, which can increase the current carrying capacity of micro probes 142. Additionally, the gram force of micro probes 142 applied on micro bump 502 can be easily adjusted by changing the length of trace lines 132 extended beyond membrane 131 into opening 133 (i.e., distance x shown in FIG. 5a).

As has been described, the present invention provides an improved probing assembly for testing integrated circuits on a wafer.

While the invention has been particularly shown and described with reference to a preferred embodiment, it will be understood by those skilled in the art that various changes in form and detail may be made therein without departing from the spirit and scope of the invention.

What is claimed is:

1. A probing assembly comprising:
    an interface board;
    a trace support element having a body and a plurality of trace lines on said body;
    a structural support element for providing structural and mechanical support to said trace support element;
    a probe support element having a plate with a plurality of guide holes in which a plurality of micro pins are inserted, wherein each of said plurality of micro pins has one end larger than the diameter of said guide holes to prevent said plurality of micro pins from passing through said guide holes, wherein at least one of said micro pins has its said larger end in contact with one of said trace lines within said trace support element; and
    a plurality of rails for securing said probe support element, said trace support element and said structural support element to said interface board.

2. The probing assembly of claim 1, wherein said trace support element has a center opening.

3. The probing assembly of claim 1, wherein said trace support element is made of a flexible electrical insulating membrane.

4. The probing assembly of claim 1, wherein said trace support element is made of a polymide film.

5. The probing assembly of claim 1, wherein said trace lines are made of beryllium copper.

6. The probing assembly of claim 1, wherein said structural support element is made of an electrical insulating material.

7. The probing assembly of claim 1, wherein said structural support element is made of polyamide-imide.

8. The probing assembly of claim 1, wherein said structural support element is made of polyetheretherketone.

9. The probing assembly of claim 1, wherein said structural support element is in a pyramidal shape configured to couple with said trace support element.

10. The probing assembly of claim 1, wherein said at least one micro pin has its other end configured to directly contact a device under test.

* * * * *